United States Patent
Park

(10) Patent No.: US 8,822,248 B2
(45) Date of Patent: Sep. 2, 2014

(54) EPITAXIAL GROWTH OF CRYSTALLINE MATERIAL

(75) Inventor: Ji-Soo Park, Andover, MA (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/342,626

(22) Filed: Jan. 3, 2012

(65) Prior Publication Data

US 2012/0098034 A1    Apr. 26, 2012

Related U.S. Application Data

(62) Division of application No. 12/476,460, filed on Jun. 2, 2009, now Pat. No. 8,183,667.

(60) Provisional application No. 61/058,542, filed on Jun. 3, 2008.

(51) Int. Cl.
H01L 21/00 (2006.01)
H01L 21/02 (2006.01)

(52) U.S. Cl.
CPC .... H01L 21/02538 (2013.01); H01L 21/02521 (2013.01); H01L 21/0262 (2013.01); H01L 21/0237 (2013.01); H01L 21/02636 (2013.01)
USPC .......................................... 438/44; 257/615

(58) Field of Classification Search
USPC .......... 438/44, 222, 226, 241, 269, 363, 384, 438/388, 413, 416, 429, 442, 478, 481, 486, 438/489, 492–509, 607, 903, 969; 257/615, 257/592, 929
See application file for complete search history.

(56) References Cited

U.S. PATENT DOCUMENTS

| | | | |
|---|---|---|---|
| 4,307,510 A | 12/1981 | Sawyer et al. |
| 4,322,253 A | 3/1982 | Pankove et al. |
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |

(Continued)

FOREIGN PATENT DOCUMENTS

| | | |
|---|---|---|
| CN | 2550906 | 5/2003 |
| DE | 10017137 | 10/2000 |

(Continued)

OTHER PUBLICATIONS

Kwok K. Ng, "Resonant-Tunneling Diode," Complete Guide to Semiconductor Devices, Chapter 10. Nov. 3, 2010, pp. 75-83.

(Continued)

*Primary Examiner* — Tony Tran
(74) *Attorney, Agent, or Firm* — Slater and Matsil, L.L.P.

(57) ABSTRACT

A device includes an epitaxially grown crystalline material within an area confined by an insulator. A surface of the crystalline material has a reduced roughness. One example includes obtaining a surface with reduced roughness by creating process parameters which result in the dominant growth component of the crystal to be supplied laterally from side walls of the insulator. In a preferred embodiment, the area confined by the insulator is an opening in the insulator having an aspect ratio sufficient to trap defects using an ART technique.

20 Claims, 10 Drawing Sheets

(56) References Cited

U.S. PATENT DOCUMENTS

| | | | |
|---|---|---|---|
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |
| 4,876,210 A | 10/1989 | Barnett et al. |
| 4,948,456 A | 8/1990 | Schubert |
| 4,963,508 A | 10/1990 | Umeno et al. |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,079,616 A | 1/1992 | Yacobi et al. |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald, Jr. et al. |
| 5,159,413 A | 10/1992 | Calviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,548,129 A | 8/1996 | Kubena |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,853,497 A | 12/1998 | Lillington et al. |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,963,822 A | 10/1999 | Saihara et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,121,542 A | 9/2000 | Shiotsuka et al. |
| 6,150,242 A | 11/2000 | Van de Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,325,850 B1 | 12/2001 | Beaumont et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,380,051 B1 | 4/2002 | Yuasa et al. |
| 6,380,590 B1 | 4/2002 | Yu |
| 6,403,451 B1 | 6/2002 | Linthicum et al. |
| 6,407,425 B1 | 6/2002 | Babcock et al. |
| 6,456,214 B1 | 9/2002 | van de Wagt |
| 6,458,614 B1 | 10/2002 | Nanishi et al. |
| 6,475,869 B1 | 11/2002 | Yu |
| 6,492,216 B1 | 12/2002 | Yeo et al. |
| 6,500,257 B1 | 12/2002 | Wang et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,053 B1 | 11/2004 | Kong et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka |
| 6,841,808 B2 | 1/2005 | Shibata et al. |
| 6,849,077 B2 | 2/2005 | Ricci |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |

(56) References Cited

U.S. PATENT DOCUMENTS

| | | |
|---|---|---|
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,951,819 B2 | 10/2005 | Iles et al. |
| 6,955,969 B2 | 10/2005 | Djomehri et al. |
| 6,955,977 B2 | 10/2005 | Kong et al. |
| 6,958,254 B2 | 10/2005 | Seifert |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,045,401 B2 | 5/2006 | Lee et al. |
| 7,049,627 B2 | 5/2006 | Vineis et al. |
| 7,061,065 B2 | 6/2006 | Horng et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,179,727 B2 | 2/2007 | Capewell et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,217,882 B2 | 5/2007 | Walukiewicz et al. |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,361,576 B2 | 4/2008 | Imer et al. |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,638,842 B2 | 12/2009 | Currie et al. |
| 7,655,960 B2 | 2/2010 | Nakahata et al. |
| 7,777,250 B2 | 8/2010 | Lochtefeld |
| 7,799,592 B2 | 9/2010 | Lochtefeld |
| 7,825,328 B2 | 11/2010 | Li |
| 7,875,958 B2 | 1/2011 | Cheng et al. |
| 8,034,697 B2 | 10/2011 | Fiorenza et al. |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0047155 A1 | 4/2002 | Babcock et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0030117 A1 | 2/2003 | Iwasaki et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |

(56) References Cited

U.S. PATENT DOCUMENTS

| | | |
|---|---|---|
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1* | 2/2007 | Pan et al. ............ 385/129 |
| 2007/0029643 A1 | 2/2007 | Johnson et al. |
| 2007/0054465 A1 | 3/2007 | Currie et al. |
| 2007/0054467 A1* | 3/2007 | Currie et al. ............ 438/458 |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0048300 A1* | 2/2008 | Yanase ............ 257/627 |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0154197 A1 | 6/2008 | Derrico et al. |
| 2008/0187018 A1 | 8/2008 | Li |
| 2008/0194078 A1 | 8/2008 | Akiyama et al. |
| 2008/0245400 A1 | 10/2008 | Li |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0042344 A1 | 2/2009 | Ye et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0012976 A1 | 1/2010 | Hydrick et al. |
| 2010/0025683 A1 | 2/2010 | Cheng |
| 2010/0072515 A1 | 3/2010 | Park et al. |
| 2010/0078680 A1 | 4/2010 | Cheng et al. |
| 2010/0176371 A1 | 7/2010 | Lochtefeld |
| 2010/0176375 A1 | 7/2010 | Lochtefeld |
| 2010/0213511 A1 | 8/2010 | Lochtefeld |
| 2010/0216277 A1 | 8/2010 | Fiorenza et al. |
| 2010/0252861 A1 | 10/2010 | Lochtefeld |
| 2010/0308376 A1 | 12/2010 | Takada et al. |
| 2011/0011438 A1 | 1/2011 | Li |
| 2011/0049568 A1 | 3/2011 | Lochtefeld et al. |
| 2011/0086498 A1 | 4/2011 | Cheng et al. |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |

(56) References Cited

FOREIGN PATENT DOCUMENTS

| | | |
|---|---|---|
| TW | 544930 | 8/2003 |
| WO | WO0072383 | 11/2000 |
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.

68 Applied Physics Letters 7, 1999, pp. 774-779 (trans. of relevant portions attached).

Ames, "Intel Says More Efficient Chips are Coming," PC World, available at: http://www.pcworld.com/printable/article/id,126044/printable.html (Jun. 12, 2006); 4 pages.

Asano et al., "AlGaInN laser diodes grown on an ELO-GaN substrate vs. on a sapphire substrate," Semiconductor Laser Conference (2000) Conference Digest, IEEE 17$^{th}$ International, 2000, pp. 109-110.

Asaoka, et al., "Observation of 1 f $^\eta$ noise of GaInP/GaAs triple barrier resonant tunneling diodes," AIP Conf. Proc., vol. 780, Issue 1, 2005, pp. 492-495.

Ashby, et al., "Low-dislocation-density GaN from a single growth on a textured substrate," Applied Physics Letters, vol. 77, No. 20, Nov. 13, 2000, pp. 3233-3235.

Ashley, et al., "Heternogeneous InSb Quantum Well Transistors on Silicon for Ultra-High Speed, Low Power Logic Applications," 43 Electronics Letters 14, Jul. 2007, 2 pages.

Bai et al., "Study of the Defect Elimination Mechanisms in Aspect Ratio Trapping Ge Growth," Applied Physics Letters, vol. 90, 2007, 3 pages.

Bakkers et al., "Epitaxial Growth on InP Nanowires on Germanium," Nature Materials, vol. 3, Nov. 2004, pp. 769-773.

Baron et al., "Chemical Vapor Deposition of Ge Nanocrystals on $SiO_2$," Applied Physics Letters, vol. 83, No. 7, Aug. 18, 2003, pp. 1444-1446.

Bean et al., "$Ge_xSi_{l-x}$/Si strained-later Superlattice grown by molecular beam Epitaxy," Journal of Vacuum Science.Technology A2 (2), Jun. 1984, pp. 436-440.

Beckett et al., "Towards a reconfigurable nanocomputer platform," ACM International Conference Proceeding Series, vol. 19, 2002, pp. 141-150.

Beltz et al., "A Theoretical Model for Threading Dislocation Reduction During Selective Area Growth," Materials Science and Engineering, A234-236, 1997, pp. 794-797.

Belyaev, et al., "Resonance and current instabilities in Aln/GaN resonant tunneling diodes," 21 Physica E 2-4, 2004, pp. 752-755.

Berg, J., "Electrical Characterization of Silicon Nanogaps," Doktorsavhandlingar vid Chalmers Tekniska Hagskola, 2005, No. 2355, 2 pages.

Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.

Bogumillowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

Borland, "Novel Device structures by selective epitaxial growth (SEG)," Electron Devices Meeting, vol. 33, 1987, pp. 12-15.

Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.

Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.

Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.

Calado, et al., "Modeling of a resonant tunneling diode optical modulator," University of Algarve, Department of Electronics and Electrical Engineering, 2005, pp. 96-99.

Campo et al., "Comparison of Etching Processes of Silicon and Germanium in SF6-O2 Radio-Frequency Plasma," 13 Journal of Vac. Sci. Tech., B-2, 1995, pp. 235-241.

Cannon et al., "Monolithic Si-based Technology for Optical Receiver Circuits," Proceedings of SPIE, vol. 4999, 2003, pp. 145-155.

Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.

Chang et al. "3-D simulation of strained Si/SiGe heterojunction FinFETs" Semiconductor Device Research Symposium, Dec. 10-12, 2003, pp. 176-177.

Chang et al., "Effect of growth temperature on epitaxial lateral overgrowth of GaAs on Si substrate," Journal of Crystal Growth, vol. 174, No. 1-4, Apr. 1997, pp. 630-634.

Chang et al., "Epitaxial Lateral Overgrowth of Wide Dislocation-Free GaAs on Si Substrates," Electrochemical Society Proceedings, vol. 97-21, May 13, 1998, pp. 196-200.

Chau et al., Opportunities and Challenges of III-V Nanoelectronics for Future High-Speed, Low Power Logic Applications, IEEE CSIC Digest, 2005, pp. 17-20.

Chen et al., "Dislocation reduction in GaN thin films via lateral overgrowth from trenches," Applied Physics Letters, vol. 75, No. 14, Oct. 4, 1999, pp. 2062-2063.

Chengrong, et al., "DBRTD with a high PVCR and a peak current density at room temperature," Chinese Journal of Semiconductors vol. 26, No. 10, Oct. 2005, pp. 1871-1874.

Choi et al., "Monolithic Integration GaAs/AlGaAs LED and Si Driver Circuit," 9 Electron Device Letters 10, Oct. 1988, 3 pages.

Choi et al., "Monolithic Integration of GaAs/AlGaAs Double-Heterostructure LEDs and Si MOSFETs," Electron Device Letters, vol. EDL-7, No. 9, Sep. 1986, 3 pages.

Choi et al., "Monolithic Integration of Si MOSFETs and GaAs MESFETs," Electron Device Letters, vol. EDL-7, No. 4, Apr. 1986, 3 pages.

Choi, et al., "Low-voltage low-power K-band balanced RTD-based MMIC VCO," 2006 IEEE, Department of EECS, Korea Advanced Institute of Science and Technology, 2006, pp. 743-746.

Cloutier et al., "Optical gain and stimulated emission in periodic nanopatterned crystalline silicon," Nature Materials, Nov. 2005, 5 pages.

Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.

Dadgar et al., "MOVPE growth of GaN on Si (111) substrates," Journal of Crystal Growth, vol. 248, Feb. 1, 2003, pp. 556-562.

Datta et al., "Silicon and III-V Nanoelectronics," IEEE International Conference on Indium Phosphide & Related Materials, 2005, pp. 7-8.

Datta et al., "Ultrahigh-Speed 0.5 V Supply Voltage In0.7Ga0.3As Quantum-Well Transistors on Silicon Substrate," 28 Electron Device Letters 8, 2007, pp. 685-687.

Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.

(56) References Cited

OTHER PUBLICATIONS

De Boeck et al., "The fabrication on a novel composite GaAs/SiO$_2$ nucleation layer on silicon for heteroepitaxial overgrowth by molecular beam Epitaxy," Material Science and Engineering, B9, 1991, pp. 137-141.

Donaton et al., "Design and Fabrication of MOSFETs with a Reverse Embedded SiGe (Rev. e-SiGe) Structure," 2006 IEDM, pp. 465-468.

Dong, Y., et al, "Selective area growth of InP through narrow openings by MOCVD and its application to InP HBT," 2003 International Conference on Indium Phosphide and Related Materials, May 12-16, 2003, pp. 389-392.

European Patent Office, Extended European Search Report and Search Opinion dated Jan. 26, 2011 in EP Patent Application No. 10003084.0-2203 (9 pages).

European Search Report issued by the European Patent Office on Dec. 15, 2010 in European Patent Application No. 10002884.4 (10 pages).

Examination Report in European Patent Application No. 06800414. 2, mailed Mar. 5, 2009, 3 pages.

Fang et al., "Electrically pumped hybrid AlGaInAs-silicon evanescent laser," 14 Optics Express 20, 2006, pp. 9203-9210.

Feltin et al., "Epitaxial lateral overgrowth of GaN on Si (111)," Journal of Applied Physics, vol. 93, No. 1, Jan. 1, 2003, pp. 182-185.

Feng et al., "Integration of Germanium-on Insulator and Silicon Substrate," 27 Electron Device Letters 11, 2006, pp. 911-913.

Fiorenza et al., "Film Thickness Constraints for Manufacturable Strained Silicon CMOS," 19 Semiconductor Science Technology, 2004, p. L4.

Fischer et al., "Elastic stress relaxation in SiGe epilayers on patterned Si substrates," 75 Journal of Applied Physics 1, 1994, pp. 657-659.

Fischer et al., "State of stress and critical thickness of Strained small-area SiGe layers," Phys. Stat. Sol. (a) vol. 171, 1999, pp. 475-485.

Fitzgerald et al., "Elimination of Dislocations in Heteroepitaxial MBE and RTCVD Ge$_x$Si$_{1-x}$ Grown on Patterned Si Substrates," Journal of Electronic Materials, vol. 19, No. 9, 1990, pp. 949-955.

Fitzgerald et al., "Epitaxial Necking in GaAs Growth on Pre-patterned Si Substrates," Journal of Electronic Materials, vol. 20, No. 10, 1991, pp. 839-853.

Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.

Fitzgerald et al., "Structure and recombination in InGaAs/GaAs heterostructures," 63 Journal of Applied Physics, vol. 3, 1988, pp. 693-703.

Fitzgerald et al., "Totally relaxed Ge$_x$Si$_{1-x}$ layers with low threading dislocation densities grown on Si Substrates," vol. 59, Applied Physics Letters 7, 1991, pp. 811-813.

Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.

Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.

Gallas et al., "Influence of Doping on Facet Formation at the SiO$_2$/Si Interface," Surface Sci. 440, 1999, pp. 41-48.

Geppert, "Quantum transistors: toward nanoelectronics," IEEE Spectrum, Sep. 2000, pp. 46-51.

Gibbon et al., "Selective-area low-pressure MOCVD of GaInAsP and related materials on planar InP substrates," Semicond. Sci. Tech. vol. 8, 1993, pp. 998-1010.

Glew et al., "New DFB grating structure using dopant-induced refractive index step," J. Crystal Growth 261, 2004, pp. 349-354.

Golka, et al., "Negative differential resistance in dislocation-free GaN/AlGan double-barrier diodes grown on bulk GaN," 88 Applied Physics Letters 17, Apr. 2006, pp. 172106-1-172106-3.

Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.

Gould et al., "Magnetic resonant tunneling diodes as voltage-controlled spin selectors," 241 Phys. Stat. Sol. (B), vol. 3, 2004, pp. 700-703.

Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.

Gruber, et al., "Semimagnetic Resonant Tunneling Diodes for Electron Spin Manipulation," Nanostructures: Physics & Technology, 8th International Symposium, 2000, pp. 483-486.

Gustafsson et al., "Cathodoluminescence from relaxed Ge$_x$Si$_{1-x}$ grown by heteroepitaxial lateral overgrowth," Journal of Crystal Growth 141, 1994, pp. 363-370.

Gustafsson et al., "Investigations of high quality Ge$_x$Si$_{1-x}$grown by heteroepitaxial lateral overgrowth using cathodoluminescence," Inst. Phys. Conf. Ser., No. 134, Section 11, Apr. 1993, pp. 675-678.

Hammerschmidt, "Intel to Use Trigate Transistors from 2009 on," EETIMES Online, available at: http://www.eetimes.com/showArticle.jhtml?articleID=189400035 (Jun. 12, 2006), 1 page.

Hasegawa, et al., "Sensing Terahertz Signals with III-V Quantum Nanostructures," Quantum Sensing: Evolution and Revolution from Past to Future, SPIE 2003, pp. 96-105.

Hayafuji et al., Japan, Journal of Applied Physics, vol. 29, 1990, pp. 2371.

Hersee et al., "The Controlled Growth of GaN Nanowires," Nano Letters, vol. 6, No. 8, 2006, pp. 1808-1811.

Hiramatsu et al., "Fabrication and characterization of low defect density GaN using facet-controlled epitaxial lateral overgrowth (FACELO)," Journal of Crystal Growth, vol. 221, Dec. 2000, pp. 316-326.

Hollander et al., "Strain and Misfit Dislocation Density in Finite Lateral Size Si$_{1-x}$Ge$_x$/Si Films Grown by Selective Epitaxy," Thin Solid Films, vol. 292, 1997, pp. 213-217.

Hu et al., "Growth of Well-Aligned Carbon Nanotube arrays on Silicon Substrates Using Porous Alumina Film as a Nanotemplate," 79 Applied Physics Letters 19, 2001, 3 pages.

Yanlong, et al., "Monolithically fabricated OEICs using RtD and MSM," Chinese Journal Semiconductors vol. 27, No. 4, Apr. 2006, pp. 641-645.

Huang et al., "Electron and Hole Mobility Enhancement in Strained SOI by Wafer Bonding," 49 IEEE Transactions on Electron Devices 9, 2002, pp. 1566-1570.

Ying-Long, et al., "Resonant tunneling diodes and high electron mobility transistors integrated on GaAs substrates," Chinese Physics Letters 23, vol. 3, Mar. 2006, pp. 697-700.

Hydrick et al., "Chemical Mechanical Polishing of Epitaxial Germanium on SiO$_2$-patterned Si(001) Substrates," ECS Transactions, 16 (10), 2008, (pp. 237-248).

Intel Press Release, "Intel's Tri-Gate Transistor to Enable Next Era in Energy-Efficient Performance," Intel Corporation (Jun. 12, 2006). 2 pages.

Intel to Develop Tri-Gate Transistors Based Processors, available at: http://news.techwhack.com/3822/tri-gate-transistors/ (Jun. 13, 2006) 6 pages.

International Preliminary Report on Patentability for International Application No. PCT/US2006/019152 mailed Nov. 29, 2007, 2 pages.

International Preliminary Report on Patentability for International Application No. PCT/US2006/029247 mailed Feb. 7, 2008, 12 pages.

International Preliminary Report on Patentability for International Application No. PCT/US2006/033859 mailed Mar. 20, 2008, 14 pages.

International Preliminary Report on Patentability for International Application No. PCT/US2007/019568 mailed Mar. 19, 2009, 10 pages.

International Preliminary Report on Patentability for International Application No. PCT/US2007/020181 mailed Apr. 2, 2009, 9 pages.

(56) References Cited

OTHER PUBLICATIONS

International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Search Report and Written Opinion for International Application No. PCT/US2007/022392 mailed Apr. 30, 2009, 14 pages.
International Search Report and Written Opinion for International Application No. PCT/US2006/019152 mailed Oct. 19, 2006, 11 pages.
International Search Report and Written Opinion for International Application No. PCT/US2006/029247 mailed May 7, 2007, 19 pages.
International Search Report and Written Opinion for International Application No. PCT/US2008/068377, mailed Jul. 6, 2009, 19 pages.
International Search Report and Written Opinion for International Application No. PCT/US2006/033859 mailed Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.
Kim et al., "Silicon-Based Field-Induced Band-to-Band Tunneling Effect Transistor," IEEE Electron Device Letters, No. 25, No. 6, 2004, pp. 439-441.
Kim et al., "GaN nano epitaxial lateral overgrowth on holographically patterned substrates," School of Physics and Inter-University Semiconductor Research Center, Seoul National University, Aug. 25-27, 2003, pp. 27-28.
Kimura et al., "Vibronic Fine Structure Found in the Blue Luminescence from Silicon Nanocolloids," Japan, Journal of Applied Physics, vol. 38, 1999, pp. 609-612.
Klapper, "Generation and Propagation of Dislocations During Crystal Growth," Mat. Chem. and Phys. vol. 66, 2000, pp. 101-109.
Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.
Kollonitsch, et al., "Improved Structure and Performance of the GaAsSb/InP Interface in a Resonant Tunneling Diode," Journal of Crystal Growth, vol. 287, 2006, pp. 536-540.
Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9 pages.
Krost et al., "GaN-based Optoelectronics on Silicon Substrates," Materials Science & Engineering, B93, 2002, pp. 77-84.
Sudirgo et al., "Si-Based Resonant Interband Tunnel Diode/CMOS Integrated Memory Circuits," Rochester Institute of Technology, IEEE, 2006, pp. 109-112.
Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.
Kushida et al., "Epitaxial growth of $PbTiO_3$ by RF magnetron sputtering," Ultrasonics, Ferroelectrics and Frequency Control, IEEE Transactions on Ultrasonics, Ferroelectrics and Frequency Control, vol. 38, No. 6, Nov. 1991, pp. 656-662.
Kwok, "Barrier-Injection Transit Time Diode," Complete Guide to Semiconductor Devices, $2^{nd}$ ed., Chapter 18, 2002, pp. 137-144.
Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.
Langdo et al., "High Quality Ge on Si by Epitaxial Necking," Applied Physics Letters, vol. 76, No. 25, Jun. 19, 2000, pp. 3700-3702.
Langdo, "Selective SiGe Nanostructures," PhD Thesis, Massachusetts Institute of Technology, Jun. 2001, 215 pages.
Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.
Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.
Li et al., "Defect Reduction of GasAs Epitaxy on Si (001) Using Sleective Aspect Ratio Trapping," 91 Applied Physics Letters, 2007, pp. 021114-1-021114-3.
Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.
Li et al., "Monolithic Integration of GaAs/InGaAs Lasers on Virtual Ge Substrates via Aspect-Ration Trapping," Journal of The Electrochemical Society, vol. 156, No. 7, 2009, pp. H574-H578.

(56) References Cited

OTHER PUBLICATIONS

Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

Li et al., "Selective Growth of Ge on Si (100) through Vias of $SiO_2$ Nanotemplate Using Solid Source Molecular Beam Epitaxy," Applied Physics Letters, vol. 83, No. 24, Dec. 15, 2003, pp. 5032-5034.

Liang et al., "Critical Thickness enhancement of Epitaxial SiGe films Grown on Small Structures," Journal of Applied Physics, vol. 97, 2005, pp. 043519-1-043519-7.

Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.

Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

Liu et al., "Rapid Melt Growth of Germanium Crystals with Self Aligned Microcrucibles on Si Substrates," Journal of the Electrochemical Society, vol. 152, No. 8, 2--5, pp. G688-G693.

Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.

Lourdudoss et al., "Semi-insulating epitaxial layers for optoelectronic devices," Semiconducting and Insulating Materials Conference, SIMC-XI, 2000, pp. 171-178.

Luan et al., "High-quality Ge Epilayers on Si with Low Threading-dislocation Densities," Applied Physics Letters, vol. 75, No. 19, Nov. 8, 1999, pp. 2909-2911.

Luan, "Ge Photodetectors for Si Microphotonics," PhD Thesis, Massachusetts Institute of Technology, Department of Materials Science & Engineering, Jan. 12, 2001, 155 pages.

Lubnow et al., "Effect of III/V-Compound Epitaxy on Si Metal-Oxide-Semiconductor Circuits," Japan, Journal of Applied Physics, vol. 33, 1994, pp. 3628-3634.

Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.

Luryi et al., "New Approach to the High Quality Epitaxial Growth of Latticed-Mismatched Materials," Applied Physics Letters, vol. 49, No. 3, Jul. 21, 1986, pp. 140-142.

Ma, et al., "A small signal equivalent circuit model for resonant tunneling diode," Chinese Physics Letters, vol. 23, No. 8, Aug. 2006, pp. 2292-2295.

Ma, et al., "Fabrication of an AlAs/In0.53/Ga0.47/As/InAs resonant tunneling diode on InP substrate for high-speed circuit applications," 27 Chinese J. Semiconductors 6, Jun. 2006, pp. 959-962.

Maekawa, et al., "High PVCR Si/Si1-x/Gex DW RTD formed with a new triple-layer buffer," Materials Science in Semiconductor Processing, vol. 8, 2005, pp. 417-421.

Maezawa, et al., "Metamorphic resonant tunneling diodes and its application to chaos generator ICs," 44 Jap. J. Applied Physics, Part 1, No. 7A, Jul. 2005, pp. 4790-4794.

Maezawa, et al., "InP-based resonant tunneling diode/HEMT integrated circuits for ultrahigh-speed operation," IEEE Nagoya University, Institute for Advanced Research, 2006, pp. 252-257.

Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.

Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.

Matthews et al., "Defects in Epitaxial Multilayers—Misfit Dislocations," Journal of Crystal Growth, vol. 27, 1974, pp. 118-125.

Monroy, et al., "High UV/visible Contrast Photodiodes Based on Epitaxial Lateral Overgrown GaN layers," Electronics Letters, vol. 35, No. 17, Aug. 19, 1999, pp. 1488-1489.

Nakano et al., "Epitaxial Lateral Overgrowth of AlN Layers on Patterned Sapphire Substrates," Source: Physica Status Solidi A, vol. 203, No. 7, May 2006, pp. 1632-1635.

Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.

Naoi et al., "Epitaxial Lateral Overgrowth of GaN on Selected-area Si (111) Substrate with Nitrided Si Mask," Journal of Crystal Growth, vol. 248, 2003, pp. 573-577.

Naritsuka et al., "InP Layer Grown on (001) Silicon Substrate by Epitaxial Lateral Overgrowth," Japan, Journal of Applied Physics, vol. 34, 1995, pp. L1432-L1435.

Naritsuka et al., "Vertical Cavity Surface Emitting Laser Fabricated on GaAs Laterally Grown on Si Substrate," Electrochemical Society Proceedings, vol. 97, No. 21, pp. 86-90.

Neudeck, et al., "Novel silicon Epitaxy for advanced MOSFET devices," Electron Devices Meeting, IEDM Technical Digest International, 2000, pp. 169-172.

Neumann et al., "Growth of III-V Resonant Tunneling Diode on Si Substrate with LP-MOVPE," Journal of Crystal Growth, vol. 248, 2003, pp. 380-383.

Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.

Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.

Noda, et al., "Current-voltage characteristics in double-barrier resonant tunneling diodes with embedded GaAs quantum rings," Physica E 32, 2006, pp. 550-553.

Norman, et al., "Characterization of MOCVD Lateral Epitaxial Overgrown III-V Semiconductor Layers on GaAs Substrates," Compound Semiconductors, Aug. 25-27, 2003, pp. 45-46.

Notification of Transmittal of the International Search Report and the Written Opinion of the International Searching Authority for PCT/US2010/029552, Applicant: Taiwan Semiconductor Manufacturing Company, Ltd., May 26, 2010, 14 pages.

Oehrlein et al., "Studies of the Reactive Ion Etching of SiGe Alloys," J. Vac. Sci. Tech, A9, No. 3, May/Jun. 1991, pp. 768-774.

Orihashi, et al., "Experimental and theoretical characteristics of sub-terahertz and terahertz oscillations of resonant tunneling diodes integrated with slot antennas," 44 Jap. J. Applied Physics, Part 1, No. 11, Nov. 2005, pp. 7809-7815.

Parillaud et al., "High Quality InP on Si by Conformal Growth," Applied Physics Letters, vol. 68, No. 19, May 6, 1996, pp. 2654-2656.

Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.

Park et al., "Defect Reduction of Selective Ge Epitaxy in Trenches on Si (001) Substrates Using Aspect Ratio Trapping," Applied Physics Letters 90, 052113, Feb. 2, 2007, 3 pages.

Park et al., "Fabrication of Low-Defectivity, Compressively Strained Geon $Si_{0.2}Ge_{0.8}$ Structures Using Aspect Ratio Trapping," Journal of the Electrochemical Society, vol. 156, No. 4, 2009, pp. H249-H254.

Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.

Partial International Search for International Application No. PCT/US2006/033859 mailed Jun. 22, 2007, 7 pages.

Partial International Search Report for International Application No. PCT/US2008/004564 completed Jul. 22, 2009, mailed Oct. 16, 2009, 5 pages.

Partial International Search Report for International Application No. PCT/US2008/068377, completed Mar. 19, 2008, mailed Apr. 22, 2008, 3 pages.

PCT International Search Report of PCT/US2009/057493, from PCT/ISA/210, mailed Mar. 22, 2010, Applicant: Amberwave System Corporation et al., 2 pages.

(56) References Cited

OTHER PUBLICATIONS

Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. QUDOS Technical Report, 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l. SOI Conf., pp. 110-111.
Suhara, et al, "Characterization of argon fast atom beam source and its application to the fabrication of resonant tunneling diodes," 2005 International Microprocesses and Nanotechnology Conf. Di. Of Papers, 2005, pp. 132-133.
Sun et al., Electron resonant tunneling through InAs/GaAs quantum dots embedded in a Schottky diode with an AlAs insertion layer, 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.
Sun et al., "Selective Area Growth of InP on InP Precoated Silicon Substrate by Hydride Vapor Phase epitaxy," Indium Phosphide and Related Materials Conference, IPRM. $14^{th}$, 2002, pp. 339-342.
Sun et al., "Sulfur Doped Indium Phosphide on Silicon Substrate Grown by Epitaxial Lateral Overgrowth," Indium Phosphide and Related Materials $16^{th}$ IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint $30^{th}$ International Conference on Infrared and Millimeter Waves & $13^{th}$ International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.
Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.

(56) References Cited

OTHER PUBLICATIONS

Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204-104.3.
Vanamu et al., "Growth of High Quality Ge/$Si_{1-x}Ge_x$ on Nano-scale Patterned Si Structures," J. Vac. Sci. Technology. B, vol. 23, No. 4, Jul./Aug. 2005, pp. 1622-1629.
Vanamu et al., "Heteroepitaxial Growth on Microscale Patterned Silicon Structures," Journal of Crystal Growth, vol. 280, 2005, pp. 66-74.
Vanamu et al., "Improving Ge $Si_xGe_{l-x}$ Film Quality through Growth onto Patterned Silicon Substrates," Advances in Electronics Manufacturing Technology, Nov. 8, 2004, pp. 1-4.
Vescan et al., "Lateral Confinement by Low Pressure Chemical Vapor Deposition-Based Selective Epitaxial Growth of $Si_{1-x}Ge_x$/Si Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al., "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Ting, et al., "Modeling Spin-Dependent Transport in InAS/GaSb/AlSb Resonant Tunneling Structures," 1 J. Computational Electronics, 2002, pp. 147-151.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.
Williams et al., "Etch Rates for Micromachining Processing—Part II," Journal of Microelectromechanical Systems, vol. 4, 1996, pp. 761-778.

Williams et al., "Etch Rates for Micromachining Processing—Part II," Journal of Microelectromechnical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-3.
Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Yamaguchi et al., "Defect Reduction Effects in GaAs on Si Substrates by Thermal Annealing," Applied Physics Letters vol. 53, No. 23, 1998, pp. 2293.
Yamaguchi et al., GaAs Solar Cells Grown on Si Substrates for Space Use: Prog. Photovolt.: Res. Appl., vol. 9, 2001; pp. 191-201.
Yamaguchi et al., "Super-High-Efficiency Multi-junction Solar Cells," Prog. Photovolt.: Res. Appl., vol. 13, 2005, pp. 125-132.
Yamamoto et al., "Optimization of InP/Si Heteroepitaxial Growth Conditions Using Organometallic Vapor Phase Epitaxy," Journal of Crystal Growth, vol. 96, 1989, pp. 369-377.
Yang et al., "High Performance CMOS Fabricated on Hybrid Substrate with Different Crystal Orientations," IEDM Tech. Dig., 2003, pp. 453-456.
Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.
Yili, et al., "Physics-based hydrodynamic simulation of direct current characteristics in DBRTD," 29 Chinese J. Electron Devices 2, Jun. 2006, pp. 365-368.
Yin et al., "Ultrathin Strained-SOI by Stress Balance on Compliant Substrates and FET Performance," 52 IEEE Trans. on Electron Devices 10, 2005, pp. 2207-2214.
Dong et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned SiO2/Si Substrate by Molecular Beam Epitaxy," Applied Physics Letters, vol. 89, 2006, pp. 063107.1-063107.3.
Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.
Zang et al., "Nanoheteroepitaxial lateral overgrowth of GaN on nanoporous Si (111)," Applied Physics Letters, vol. 88, No. 14, Apr. 3, 2006, pp. 141925.
Zang et al., "Nanoscale lateral epitaxial overgrowth of GaN on Si (111)," Applied Physics Letters, vol. 87, No. 19 (Nov. 7, 2005) pp. 193106.1-193106.3.
Zela et al., "Single-crystalline Ge Grown Epitaxially on Oxidized and Reduced Ge/Si (100) Islands," Journal of Crystal Growth, vol. 263, 2004, pp. 90-93.

(56) References Cited

OTHER PUBLICATIONS

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

\* cited by examiner

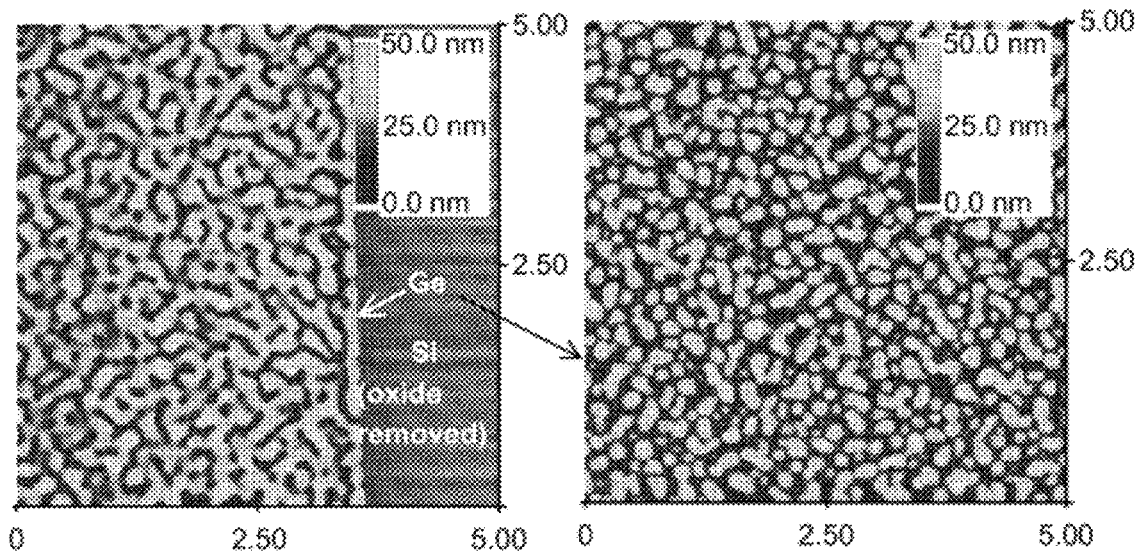
FIG. 1A
FIG. 1C
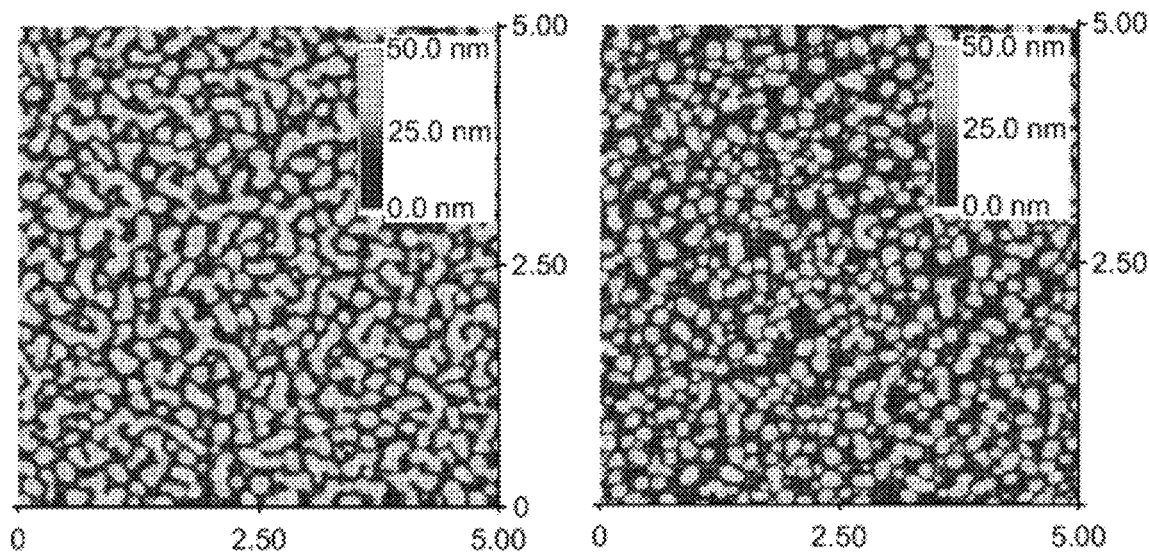
FIG. 1B
FIG. 1D

EPITAXIAL GROWTH OF CRYSTALLINE MATERIAL

CROSS-REFERENCE TO RELATED APPLICATIONS

The present application is a divisional of U.S. patent application Ser. No. 12/476,460, filed on Jun. 2, 2009, and entitled "Epitaxial Growth of Crystalline Material," which claims priority from U.S. Provisional Patent Application Ser. No. 61/058,542, filed on Jun. 3, 2008, which disclosures are hereby incorporated by reference in their entireties.

BACKGROUND OF THE INVENTION

1. Field of the Invention

The present invention relates to epitaxial growth of a crystalline material. The improved growth may occur within a confined area, such as within an opening or trench formed in an insulator.

2. Description of the Related Art

The formation of lattice-mismatched materials has many practical applications. Heteroepitaxial growth of group IV materials or compounds, and III-V, III-N and II-VI compounds on a crystalline substrate, such as silicon, has many applications such as photovoltaics, resonant tunneling diodes (RTD's), transistors (e.g., FET (which can be planar or 3D (i.e., finFET), HEMT, etc.), light-emitting diodes and laser diodes. As one example, heteroepitaxy of germanium on silicon is considered a promising path for high performance p-channel metal-oxide-semiconductor (MOS) field-effect transistors (FET) and for integrating optoelectronic devices with silicon complementary MOS (CMOS) technology. Heteroepitaxially growing Ge on Si also is a path for providing a substitute for Ge wafers for many other applications such as photovoltaics, light-emitting diodes, and laser diodes provided that a sufficiently high-quality Ge surface can be obtained cost-effectively. Heteroepitaxy growth of other materials (e.g., of group III-V, III-N, and II-VI compounds and other group IV materials or compounds) also is beneficial for these and other applications.

However, the dislocation density of the epitaxially grown material can be unacceptably high for many applications. For example, the dislocation density of germanium directly grown on silicon can be as high as $10^8$-$10^9$ cm$^{-2}$ due to the 4.2% lattice mismatch between the two materials—unacceptable for most device applications. Various approaches to reducing the defect density have been pursued, including compositional grading, and post-epi high-temperature annealing. However, these approaches may not be optimal for integration with silicon-based CMOS technology due to requirements for thick epi-layers and/or high thermal budgets, or due to incompatibility with selective growth at a density suitable for CMOS integration.

Aspect Ratio Trapping (ART) is a defect reduction technique which mitigates these problems. As used herein, "ART" or "aspect ratio trapping" refers generally to the technique(s) of causing defects to terminate at non-crystalline, e.g., dielectric sidewalls, where the sidewalls are sufficiently high relative to the size of the growth area so as to trap most, if not all, of the defects. ART utilizes high aspect ratio openings, such as trenches or holes, to trap dislocations, preventing them from reaching the epitaxial film surface, and greatly reduces the surface dislocation density within the ART opening. FIGS. 7A and 7B respectively show a cross section and perspective view of an epitaxially grown crystalline material 140 using ART. As illustrated, a crystalline material 140 is epitaxially grown on substrate 100 (here, on the (001) surface of a silicon substrate). By confining the crystalline growth within an opening (e.g., trench) with a sufficiently high aspect ratio (e.g, 1 or greater), defects 150 formed while epitaxially growing the crystalline material 140 travel to and end at the insulator sidewalls 130. Thus, the crystalline material 140 continues to grow without the continued growth of the defects 150, thereby producing crystal with reduced defects. This technique has been shown to be effective for growing low defectivity materials such as Ge, InP and GaAs selectively on Si in trenches as wide as 400 nm and of arbitrary length—an area large enough for devices such as a FET, for example.

Selective growth behavior on $SiO_2$-patterned Si substrate is known to differ significantly from the growth on blanket substrates, due to the so-called "loading effect". Thus, even when using the same process (temperature, pressure, time, precursor gas, etc.) are used to epitaxially grow material across a large area of a substrate (blanket epixatial growth) and on a substrate within an area confined by an insulator (e.g., on Si within an opening or trench in $SiO_2$), different results may be obtained. Growth behavior depends not only on the total area ratio of Si-to-$SiO_2$ over the wafer but also on the size of the openings of individual Si windows. It has been reported that the loading effect is reduced through a reduction of the growth pressure or through an addition of HCl to the growth ambient. Other studies have focused on the pattern dependence of the growth rate and germanium content of selective SiGe. However, there are few studies on selective Ge, especially on the initial growth stage of Ge which determines the surface morphology of the layer.

When manufacturing a device which includes an active portion of the crystal material within an opening of surrounding dielectric, it is often desirable to obtain a smooth crystal surface within the opening. For example, a high surface roughness of the surface of a lower layer (e.g., an n-doped crystalline layer) would create higher variances in an interface between this lower layer and an upper layer (e.g., a p-doped crystalline layer) formed on this lower layer from one location to the next. These interface variances affect the functionality of the interface from one device to another device on the same substrate (e.g., differences in diode devices formed by p-n junctions differ from variances of the junctions, or interfaces, of the p and n crystalline materials). Thus, the same devices produced on the same substrate (e.g., same sized diodes, transistors, LEDs, LD's, etc. on the same silicon wafer) may undesirably vary in their operational characteristics. This may result in requiring higher operating tolerances and possibly device failure.

For the growth of smooth Ge layers on a blanket substrate, two-step growth, which comprises a thin low temperature buffer (330-450° C.) followed by a thick high temperature layer (600-850° C.) has been utilized. However, none of these processes were shown to be able to create smooth surfaces of Ge in a confined location, such as an opening or trench in an insulator. As noted above, the selective growth (e.g., in an opening or trench) is known to differ from growth on blanket substrates. Further, growth at the lower temperatures was performed by molecular beam epitaxy, which is currently undesirable for commercial applications.

Chemical mechanical polishing (CMP) of the selectively grown crystalline material may not be an option to smooth the surface of the crystalline material if it is not desired to grind the surrounding dielectric layer to the same height. Further, known processes which obtain acceptable surface roughness for blanket expitaxial grown materials have been found to obtain higher surface roughness for selective epitaxial grown materials.

Thus, there is a need to reduce the surface roughness of materials grown in a confined area or selectively grown. In particular, there is a need to reduce the surface roughness of crystalline materials grown in an ART opening.

SUMMARY OF THE INVENTION

Therefore, it is an aspect of one embodiment of the invention to provide an epitaxially grown crystalline material with a reduced surface roughness.

An alternative aspect, one embodiment the invention provides a process for the low temperature growth of crystalline material. Such growth may be done with a CVD process.

In yet another aspect, one embodiment of the invention provides a process for the epitaxial growth of a crystalline material where the dominant growth component is provided by the lateral supply of the crystalline material containing species, such as from sidewalls of an insulator. The growth component of the crystalline material containing species from the growth ambient may be substantially reduced.

These aspects may be especially applicable to devices incorporating ART techniques, including but not limited to a mixed signal application device, a field effect transistor, a quantum tunneling device, a light emitting diode, a laser diode, a resonant tunneling diode and a photovoltaic device. The ART devices may have crystalline material epitaxially grown in openings or confined areas with an aspect ratio (depth/width)>1, or otherwise suitable for trapping most defects.

Additional aspects and utilities of the invention will be set forth in part in the description which follows and, in part, will be obvious from the description, or may be learned by practice of the invention.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIG. 1, comprising FIGS. 1(a)-1(d), illustrates 5 μm×5 μm AFM of Ge layers grown at 600° C. for 15 seconds. FIG. 1(a) illustrates the AFM at the edge of 6 mm×6 mm Si window in oxide-field which was removed using a dilute HF. FIG. 1(b) illustrates the AFM at 80 μm from this edge, and FIG. 1(c) illustrates the AFM at 150 μm from oxide-field. FIG. 1(d) illustrates a 5 μm×5 μm AFM of a Ge layer grown at 600° C. for 15 seconds on blanket Si.

FIG. 2 comprises FIGS. 2(a)-2(f).

FIG. 3 comprises FIGS. 3(a)-3(f).

FIG. 5, comprising

DETAILED DESCRIPTION OF THE PREFERRED EMBODIMENTS

Figure 2A:
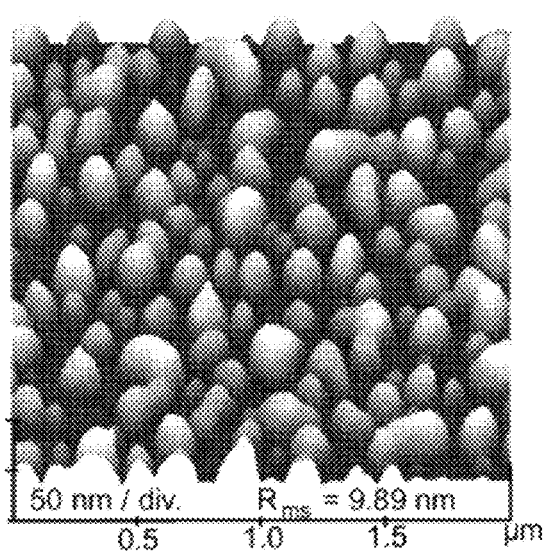
FIGS. 2(a)-(c) illustrates three-dimensional AFM images of Ge layers grown at 600° C. on blanket Si for 15 sec (FIG. 2(a)), 90 sec (FIG. 2(b)), and 180 sec (FIG. 2(c)).

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Figure 6A:
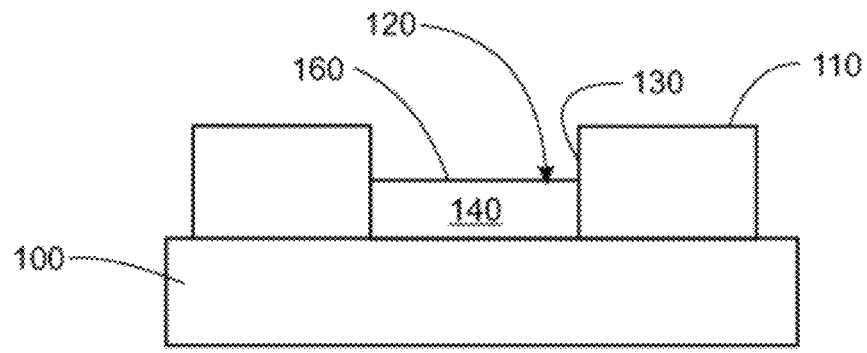
FIGS. 6A, 6B and 6C illustrate example configurations of a crystalline material grown on a substrate according to the invention.

An embodiment of the invention is directed to a device including an epitaxially grown crystalline material in an opening in an insulator. FIG. 6A shows one example, illustrating a cross section of a portion of the device. As shown in FIG. 6A, the example includes a crystalline material 140 grown on a substrate 100 in an opening 120 defined in an insulator 110. The substrate 100 may be a crystalline material such as silicon, Ge or sapphire. Insulator 110 is preferably a non-crystalline material such as $SiO_2$. The crystalline material at least at some stage during its growth has a surface, for example surface 160, below the top surface of insulator 110. The surface 160 has a surface roughness Rms (root mean square, also sometimes denoted as "Rrms" and "Rq") of less than or equal to 5 nm. The surface roughness (Rms) of surface 160 may be less than or equal to 3 nm, or less than or equal to about 1 nm. The surface roughness (Rms) of surface 160 may also be no greater than 0.55 nm In one example, the width of the opening 120 may be 400 nm or less, 350 nm or less or 200 nm or less, 100 nm or less, or 50 nm or less; these sizes have been shown to be effective for ART (of course these sizes do not need to be used with ART). Alternatively, the width of the opening may be 5 µm or less. In another alternative, the width of the opening may be 1 µm or less. The opening may be as great as 200 µm or less, as shown by the following description. The opening may be formed as a trench (with the length of the trench running perpendicular to the cross section shown in FIG. 6A) in which case the width would be considered to be perpendicular to its length and height. The length of the trench may be arbitrary. Alternatively, the length of the trench may be substantially larger than the width of the trench, for example greater than 10 times larger, or greater than 100 times larger. In one example, the length of the trench is 6 mm.

It is preferred, but not necessary, that the opening 120 is used to trap defects when epitaxially growing the crystalline material 140 using ART (aspect ratio trapping) techniques. In such a case, the aspect ratio (AR—height/width) may be greater than 1, although it possible for the aspect ratio to be lower in ART devices, for example as low as 0.5. (Aspect ratio "AR" is defined for trenches as the ratio of the trench height/trench width.) Further details of example ART devices and ART techniques in which this invention may be incorporated may be found in U.S. patent application Ser. No. 11/436,198 filed May 17, 2006; Ser. No. 11/493,365 filed Jul. 26, 2006; and Ser. No. 11/852,078 filed Sep. 7, 2007, all of which are hereby incorporated by reference.

Figure 6B:
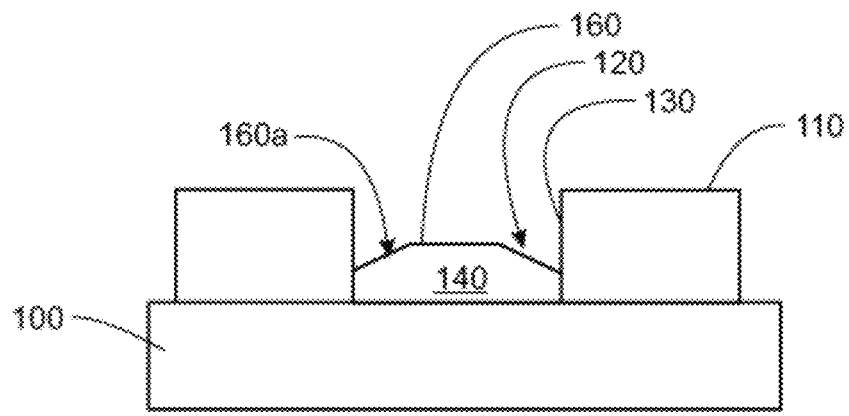
Figure 6C:
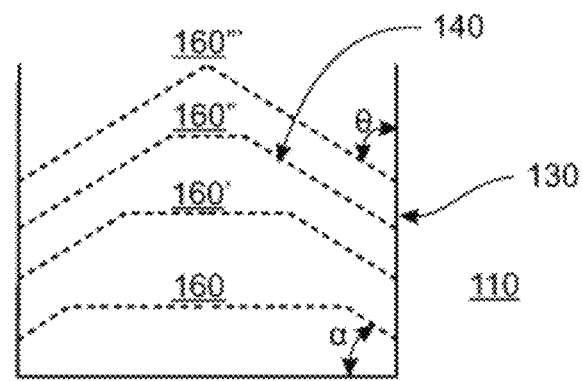
Figure 7A:
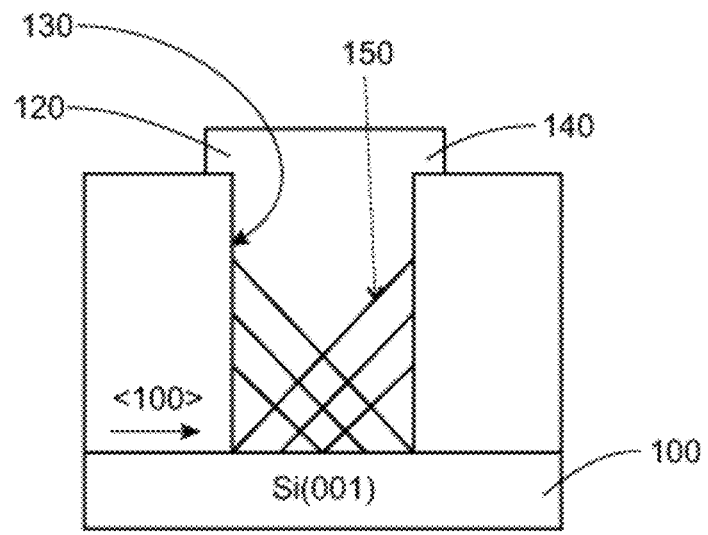
FIGS. 7A and 7B respectively show a cross section and perspective view of an epitaxially grown crystalline material 140 using ART.
Figure 7B:
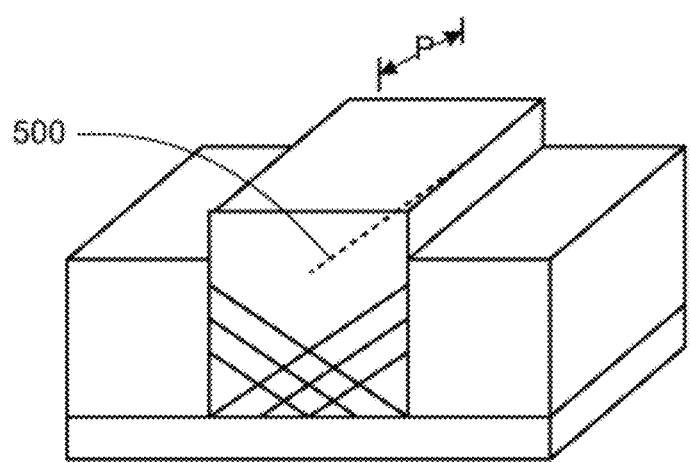

FIG. 6A illustrates the crystalline material 140 with a continuous non-faceted surface extending between the sidewalls 130 of insulator 110 which form opening 120. Alternatively, the surface 160 of crystalline material 140 may include facets 160a as shown in FIG. 6B. "Facet" is used herein to denote any major surface of the epitaxial material that is not parallel to an underlying surface of substrate surface 100. Further, as shown in FIG. 6C, the surface of crystalline material 140 may only include faceted surfaces 160a (i.e., not include any surface parallel to the surface of substrate 100), as exemplified by surface 160'''. Unless otherwise noted, when measuring surface roughness of surfaces including facets, deviation of the surface height due to the faceting is included in calculating surface roughness for the faceted surface.

FIG. 6C also illustrates an implementation of the invention where additional epitaxial growth of the crystalline material 140 occurs above the initial surface 160. FIG. 6C shows surfaces 160', 160'' and 160''' subsequently grown above an initial surface 160. These additional surfaces may grow in a single epitaxial growth process with no change to process parameters. Alternatively, the process parameters may be changed to alter the characteristics of the subsequently grown crystalline material 140. For example, doping levels and/or doping type may be altered during the growth process (e.g., to obtain a p-n junction or a p-i-n quantum device). In such an implementation, one or more of the surfaces (in this example, one or more of surfaces 160, 160', 160'', 160''') may have the surface roughness parameters described above with respect to FIG. 6A. It is also possible to use several different processes to obtain the multiple surfaces. Although not shown in FIGS. 6A-6C, it is of course possible to form (epitaxially grow or deposit by sputtering or CVD) a different material altogether on surface 160. As is obvious from this discussion, in this disclosure, a "surface" of an epitaxially grown crystalline material indicates a boundary of the epitaxially grown material during some period of its growth. Such a "surface" does not cease to exist simply due to the forming of additional material on this surface, whether or not such additional material is homogeneous with the material on which it is deposited, and whether or not the additional material is deposited in the same process with the same process parameters The surfaces 160 of the crystalline material 140 of the examples illustrated in FIGS. 6A, 6B and 6C are all below the height of the top surface of insulator 110. In another embodiment of the invention (not shown), one or more the surfaces 160 of the crystalline material may partly or fully extend past the top surface of insulator 110. The one or more surfaces obtained from the epitaxial growth of the crystalline material may have a surface roughness Rms less than or equal to 5 nm, may be less than or equal to 3 nm, or may be less than or equal to about 1 nm. The surface roughness of surface of this/these surface(s) 160 may also be no greater than 0.55 nm.

The substrate 100 in the above examples may include a group IV element or compound, such as germanium and/or silicon, e.g., (100) silicon. The crystalline material 140 may include at least one of a group IV element or compound, a III-V or III-N compound, or a II-VI compound. Examples of group IV elements include Ge and Si, and examples of group IV compounds include SiGe. Examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds. Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

Figure 8:
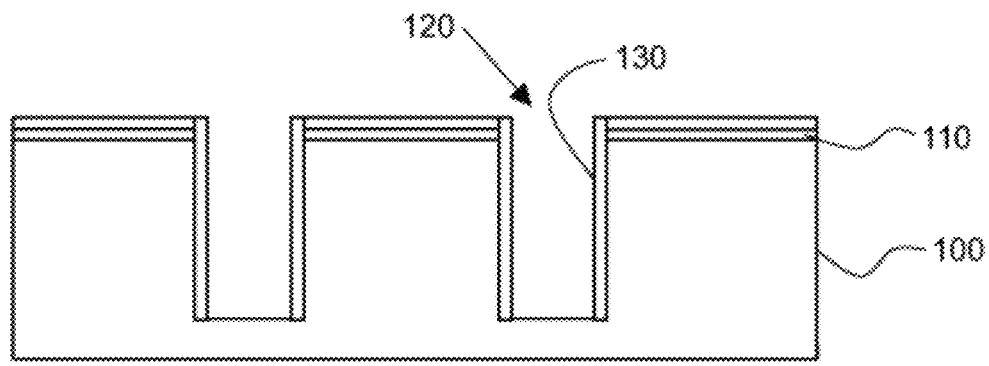
FIG. 8 illustrates another example of the confined area in which crystalline material may be epitaxially grown.

The layer of insulator need not be formed as a substantially planar layer. For example, the insulator may be formed of a thin layer which conforms to an undulating surface of the substrate on which it is deposited. FIG. 8 illustrates on example including a substrate which has openings/trenches etched into the substrate. An insulating layer 110 has been formed across the substrate 100 conforming to the surface topography of the etched substrate 100. The insulating layer 110 has portions at the bottom of the openings/trenches to expose portions of the substrate 100 on which the crystalline material will be grown. In this case, the sidewalls of the insulator are formed from the outer surface of the insulator 110 after its deposition and are not formed by a separate photolithography and etch process.

The following description in connection with FIGS. 1-4 explains examples of how the surfaces of the crystalline material grown within a confined space (e.g., in opening 120 in insulator 110) may be obtained with reduced surface roughnesses. Although this description is in connection with specific materials and process parameters, it will be apparent that the description is exemplary only, and should not be considered to limit the invention to such materials and process parameters.

The following materials and process parameters were used for all of the Ge grown as discussed in connection with FIGS. 1-5. The starting substrates used in this work were crystalline silicon, 200 mm diameter, p-type, and (001) oriented. A 500-nm-thick thermal oxide was grown on the substrate. The oxide layer was patterned into trenches along [110] direction of the silicon substrate having 350 nm width and 6 mm length. A section of the wafer had 6 mm×6 mm exposed Si area in the oxide-field which was used to characterize selective Ge growth as a function of the distance from the oxide-field. The trenches were formed using conventional photolithography techniques and a reactive ion etching (RIE) step. The patterned substrates were then cleaned in Pirana, SC2, and dilute HF solutions sequentially. Removal of fluorocarbon residues caused by RIE was accomplished using a 25-nm-thick sacrificial oxidation and subsequent HF oxide etch. The final trench height was 490 nm after this cleaning procedure. Ge layers were grown by chemical vapor deposition (CVD) on the exposed Si substrate (either in the trenches, in the 6 mm×6 mm section, or on a blanket Si substrate (i.e., a bare Si wafer)) in an industrial ASM Epsilon E2000 system. This CVD system is a horizontal, cold-wall, single wafer, load-locked reactor with a lamp-heated graphite susceptor in a quartz tube. Directly prior to growth, the substrates were cleaned in a diluted HF solution and rinsed in DI (deionized) water. The substrates were loaded into the growth chamber and baked in H2 for 1 minute at 870° C. The pressure during the bake was set the same value as used in the subsequent growth step, 80 Torr. The growth step used a 30 sccm germane (GeH4) source gas flow diluted to 25% in a 20 slm hydrogen carrier gas flow. 100 ppm B2H6 and 1000 ppm PH3 balanced in H2 were used for in-situ boron and phosphorus doping, respectively. As discussed in more detail below, growth temperature was varied from 350° C. to 600° C., as was the time for growth.

After the Ge growth, the 490-nm-thick oxide which formed the trenches was removed using a diluted HF to enable material characterization. The sample roughness was characterized by tapping-mode atomic force microscopy (AFM) with a Veeco Dimension 3100. The boron and phosphorous doping level was measured with secondary ion mass spectrometry (SIMS) with an IMS 6-f using an oxygen and cesium ion beam, respectively.

FIGS. 1(a)-1(c) show the AFM images of Ge layers grown at 600° C. for 15 seconds on the very edge of 6 mm×6 mm Si window in the oxide-field (FIG. 1(a)) and at 80 μm (FIG. 1(b)) and 150 μm (FIG. 1(c)) distances from the oxide-edge. An AFM image of Ge grown at 600° C. for 15 seconds on blanket Si is also shown in FIG. 1(d) for comparison. Close to the oxide-field, the Ge islands are all connected to one another [FIG. 1(a)]. At greater distances from the oxide-field, Ge islands become more discrete and, as a result, the surface microstructure becomes more similar to the one on blanket Si [FIGS. 1(b)-1(d)]. However, even the surface microstructure of Ge at 150 μm distances from the oxide [FIG. 1(c)] is slightly different from that on blanket Si [FIG. 1(d)], which has smaller and more discrete islands. These results indicate that a significant amount of Ge-containing species for selective Ge growth is laterally supplied from the oxide-field. In addition, the lateral transport of Ge-containing species reaches at least on the order of ~100 μm range at these growth conditions. This value is similar with the one obtained from selective InGaAs growth in which the variation of local In composition was on the order of 100 μm range depending on growth pressure (see T. I. Kamins, D. W. Vook, P. K. Yu, and J. E. Turner, Appi. Phys. Lett., 61, 669 (1992)). It was claimed that the lateral diffusion of reactants which caused local variation of In composition in InGaAs layer was through the gas phase, not on the surface. In selective SiGe growth, the growth rate uniformity increases at lower pressure where gas phase diffusion is more dominant indicating that Ge might be supplied from the oxide through gas phase diffusion.

Figure 2D:
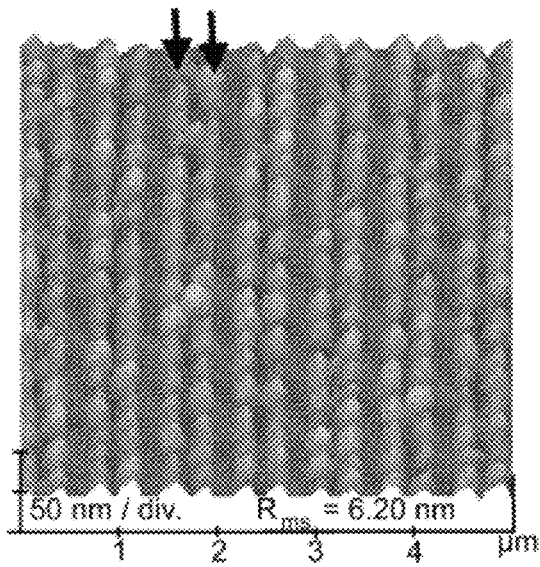
FIGS. 2(d)-(f) illustrate three-dimensional AFM images of Ge layers grown at 600° C. on Si within 350-nm-wide oxide-trenches after oxide removal for 15 sec (FIG. 2(d)), 90 sec (FIG. 2(e)), and 180 sec (FIG. 2(f)). Scan size of growth on blanket Si (FIGS. 2(a)-(c)) is 2 μm×2 μm, and scan size of growth within oxide trenches (FIGS. 2(d)-(f)) is 5 μm×5 μm. Vertical scale and root-mean-square roughness (Rms) are shown on the left and right bottom of each image, respectively. Rms of the Ge on oxide-trench was calculated only on the Ge area and did not include Si where oxide was removed.
Figure 2B:
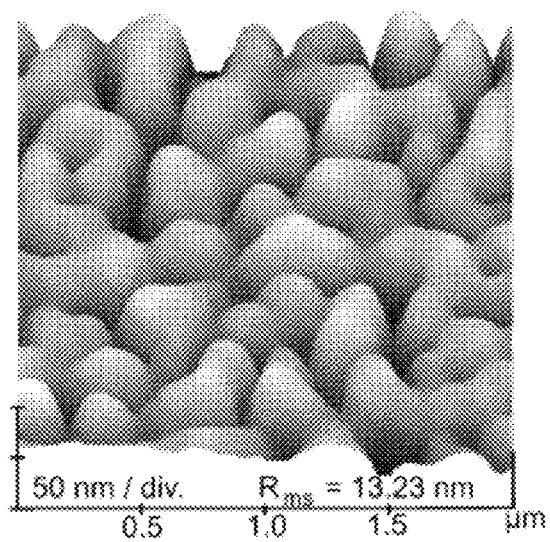
Figure 2E:
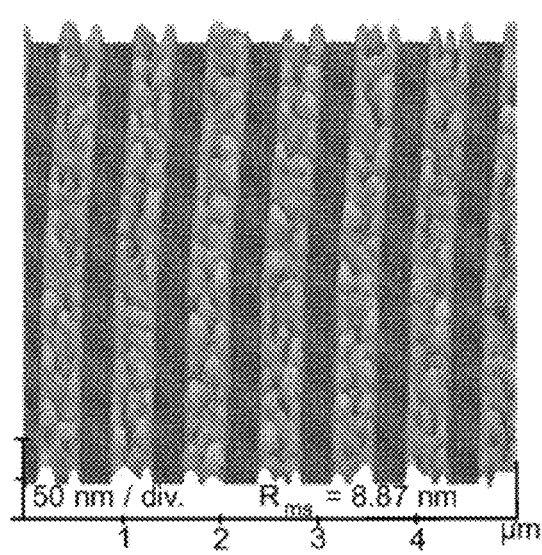
Figure 2C:
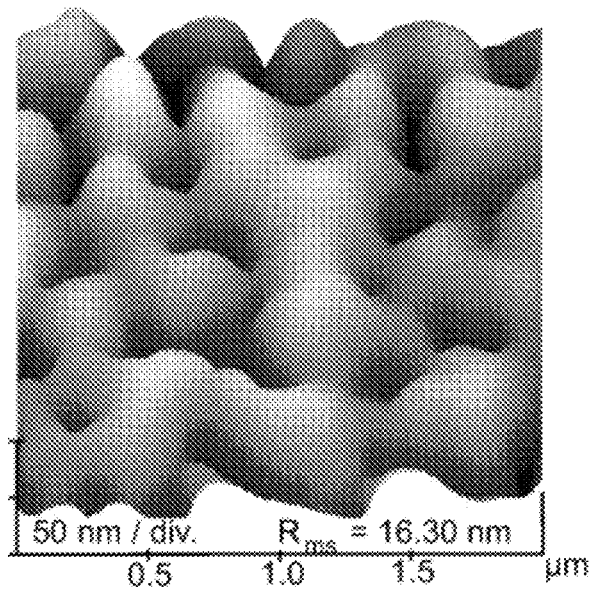
Figure 2F:
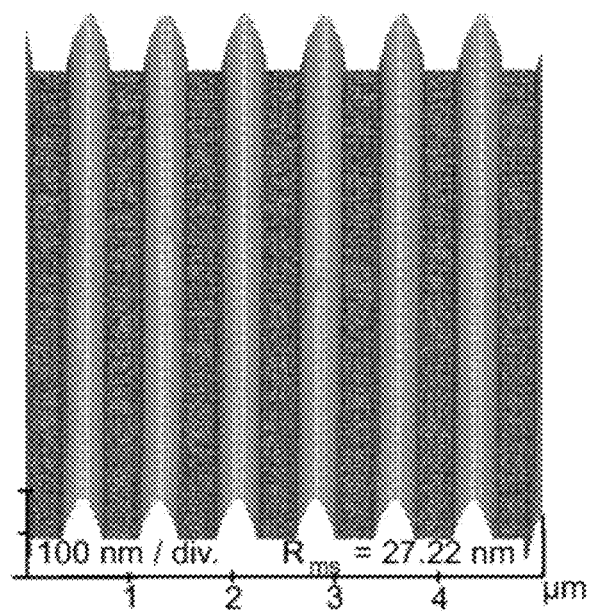

FIGS. 2(a)-2(c) illustrate the surface morphology of Ge layers grown at 600° C. on blanket Si substrates. FIGS. 2(d)-2(f) illustrate the surface morphology of Ge layers grown at 600° C. on Si located at the bottom of the oxide-trench described above. FIGS. 2(a) and 2(d) illustrate results for Ge growth for 15 seconds. FIGS. 2(b) and 2(e) illustrate Ge growth for 90 seconds. FIGS. 2(c) and 2(f) illustrate Ge growth for 180 seconds. A 15 sec growth of Ge on blanket Si at 600° C. exhibits an island growth [FIG. 2(a)] and longer growth shows the coalescence of Ge islands causing a rougher surface [FIGS. 2(b)-2(c)]. This island growth on blanket Si substrate has been reported to be due to the relaxation of misfit strain between Ge and Si, which leads to three-dimensional islands from initial, pseudomorphic, and two-dimensional wetting layers.

On the oxide-trench Si substrate (where the oxide sidewall was removed after growth using a dilute HF), Ge islands were preferentially nucleated and grown at the edge of the trenches after 15 sec growth as indicated by arrows in FIG. 2(d). The lateral diffusion length of Ge containing species from the oxide sidewall was in the range of ~100 μm as discussed above. Thus, the selective Ge growth inside the 350-nm-wide trenches has a substantial component provided by the lateral supply of Ge-containing species from the oxide sidewall, in addition to a growth component due to direct supply of Ge-containing species from the growth ambient. The preferential formation of Ge islands at the edge of trench adjacent the oxide sidewalls is consistent with previous reports showing that Ge dots grown at 700° C. were mainly nucleated at the boundary of SiO2 window. It has been ascribed to the tensile strained Si at the edge of the window claiming that the higher thermal expansion coefficient of Si than that of SiO2 can make Si tensile strained near the edge and compressively strained near the center when cooled from higher bake temperature to the growth temperature. Due to the coalescence of these islands preferentially formed on the edge of the trench, Ge layer in the trench becomes rougher (Rms=8.87 nm) after longer growth [FIG. 2(e)]. And further growth resulted in (111) and (311) facet formation as shown in FIG. 2(f), resulting in a surface roughness of Rms=27.22 nm.

Figure 3A:
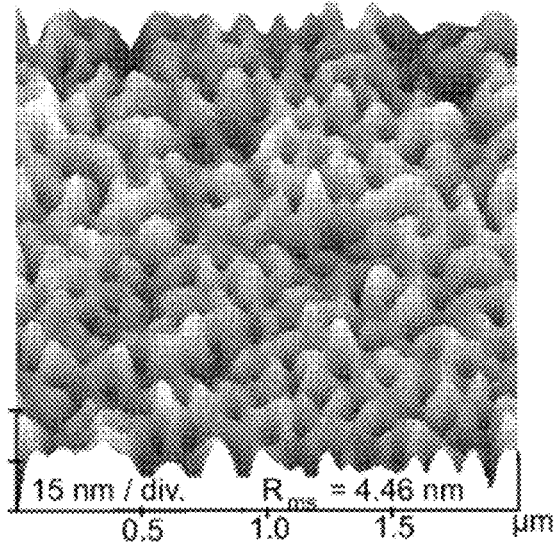
FIGS. 3(a)-(c) illustrate three-dimensional AFM images of Ge layers grown at 400° C. on blanket Si for 270 sec (FIG. 3(a)), 360 sec (FIG. 3(b)), and 540 sec (FIG. 3(c)).
Figure 3B:
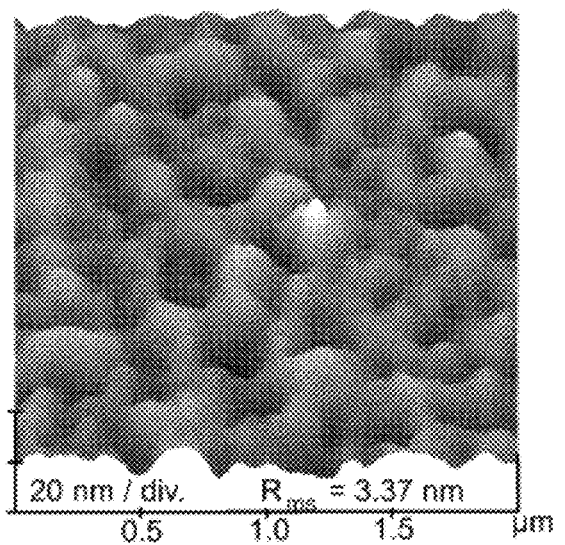
Figure 3D:
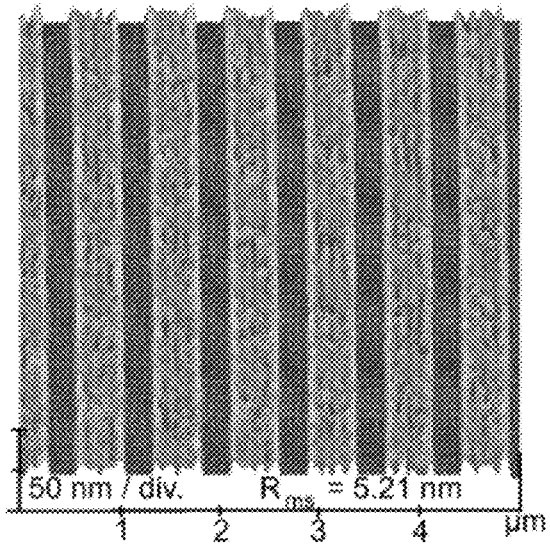
FIGS. 3(d)-(f) illustrate three-dimensional AFM images of Ge layers grown at 400° C. on Si within 350-nm-wide oxide-trenches after oxide removal for 270 sec (FIG. 3(d)), 360 sec (FIG. 3(e)), and 540 sec (FIG. 3(f)). Scan size of growth on blanket Si (FIGS. 3(a)-(c)) is 2 μm×2 μm and scan size of growth within oxide trenches (FIGS. 3(d)-(f)) is 5 μm×5 μm. Vertical scale and root-mean-square roughness (Rms) are shown on the left and right bottom of each image, respectively. Rms of the Ge on oxide-trench was calculated only on the Ge area and did not include Si where oxide was removed.
Figure 3E:
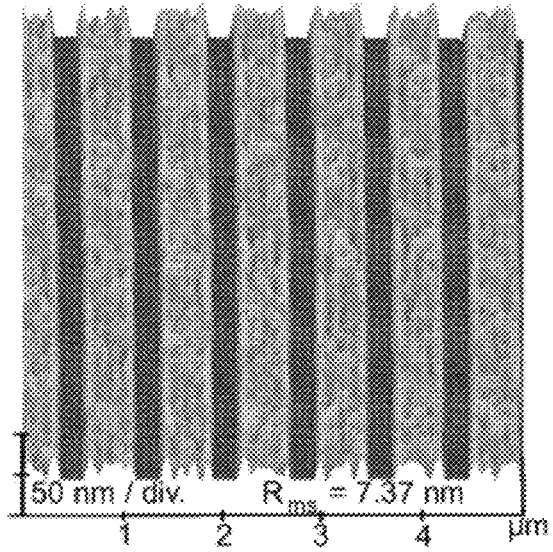
Figure 3C:
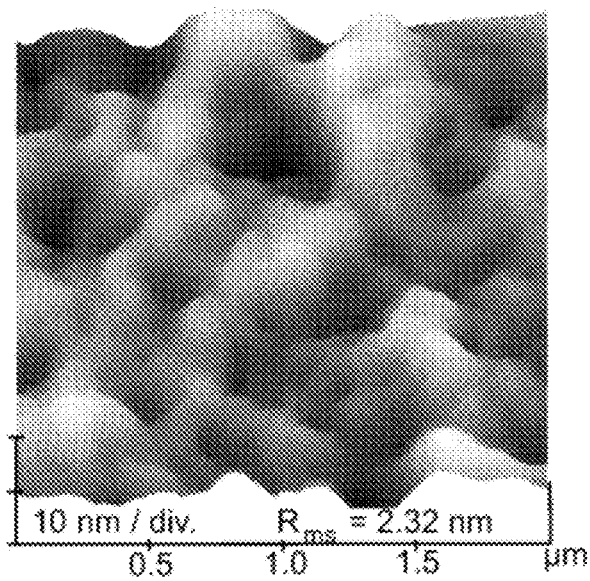
Figure 3F:
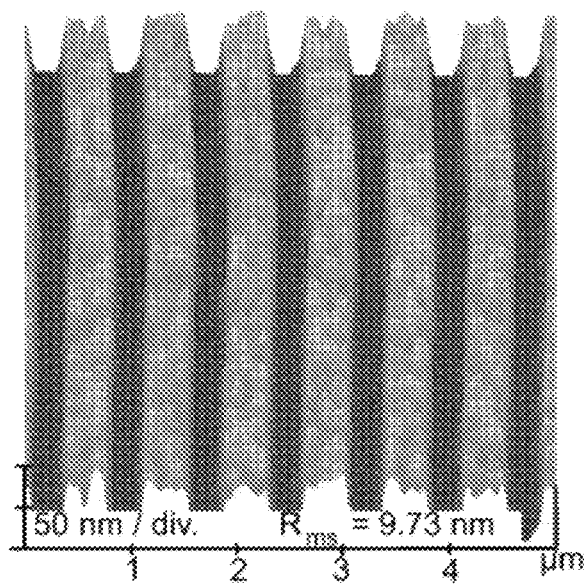

FIGS. 3(a)-(c) illustrate the surface morphology of Ge layers grown at 400° C. on blanket Si substrates for time periods of 270 seconds, 360 seconds, and 540 seconds, respectively. FIGS. 3(d)-3(f) illustrate the surface morphology of Ge layers grown at 400° C. on Si located at the bottom of the oxide-trench described above for time periods of 270 seconds, 360 seconds, and 540 seconds, respectively. Ge layer grown on blanket Si at 400° C. shows higher island density with smaller size than the one at 600° C. [FIG. 3(a)]. This may be attributed to a reduced surface mobility at lower temperature at which Ge atoms are less likely to diffuse to existing islands due to a low mobility but clustering to form a new nucleus. The 400° C. growth requires longer growth time for the coalescence of islands due to a lower growth rate and a longer incubation time. As a result the surface roughness becomes significantly lower as compared to 600° C. growth. This is shown in FIGS. 3(b) and (c) where a higher density of smaller islands lead to a lower surface roughness as the growth proceeds resulting in surface roughness Rms of 3.37 and 2.32 respectively, lower than the surface roughness Rms of 4.46 of FIG. 3(a).

In the oxide-trench Si substrates, the preferential island formation at the edge of the trench was notably reduced compared to 600° C. However, longer growth of Ge layers inside the trench at 400° C. results in even rougher surface. As shown in surface roughness increases from Rms surface roughness of 5.21 nm (FIG. 3(d)) to 7.37 nm (FIG. 3(e)) to 9.73 nm (FIG. 3(f)) with increased growth times (from 270 seconds, to 360 seconds and 540 seconds). This is in contrast to the growth on blanket Si which leads to smoother surface with thicker layer [FIGS. 3(a)-3(c)].

These results show that Ge growth inside the oxide-trench, where the lateral supply of Ge is dominant, does not show smooth surfaces at the initial stage of growth at 400° C. unlike on blanket Si. To the contrary, Ge surface roughness inside the oxide-trench becomes higher as it gets thicker. On oxide-trench Si, the lateral diffusion of Ge-containing species dominates in the entire area of the trench due to its small size. Thus, the increased growth rate resulting from the lateral supply of Ge-containing species inside the small trench might cause a rougher surface as it gets thicker.

Figure 4A:
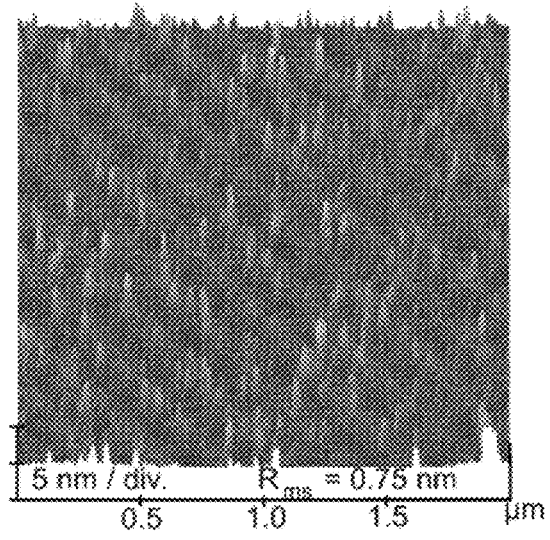
FIGS. 4(a) and (b) illustrate three-dimensional AFM images of Ge layers grown at 350° C. on blanket Si for 750 sec (FIG. 4(a)) and 2000 sec (FIG. 4(b)).
Figure 4C:
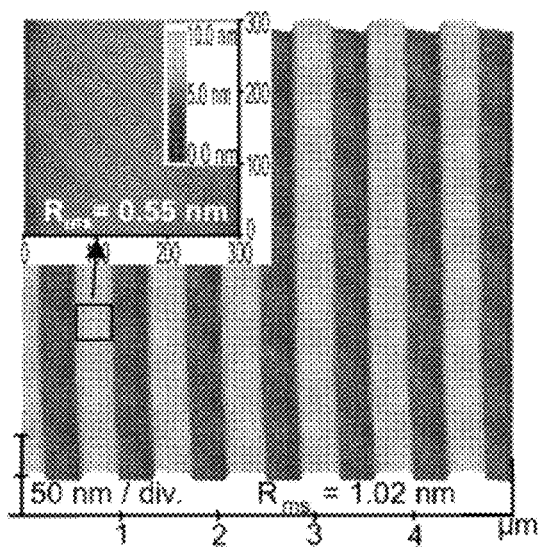
FIGS. 4(c) and (d) illustrate three-dimensional AFM images of Ge layers grown at 350° C. on Si within 350-nm-wide oxide-trenches after oxide removal for 320 sec (FIG. 4(c)) and 2000 sec (FIG. 4(d)). Scan size of growth on blanket Si (FIGS. 4(a) and (b)) is 2 μm×2 μm and scan size of growth within oxide trenches (FIGS. 4(c) and (d)) is 5 μm×5 μm. Vertical scale and root-mean-square roughness (Rms) are shown on the left and right bottom of each image, respectively. Rms of the Ge on oxide-trench was calculated only on the Ge area and did not include Si where oxide was removed. The inset in Figure (c) is a 300 μm×300 μm AFM image obtained on Ge inside the trench.
Figure 4B:
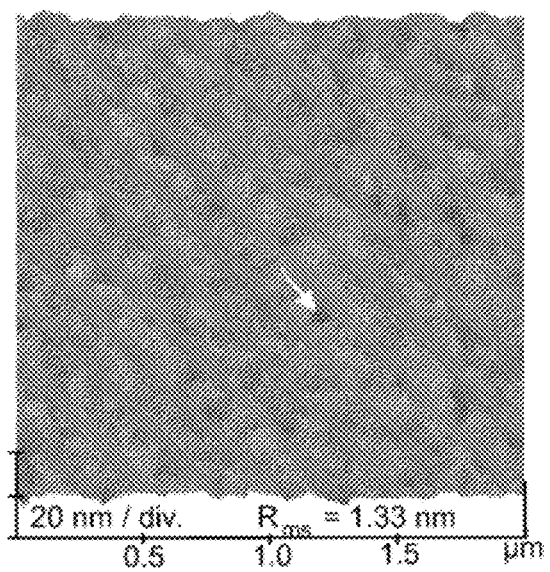
FIG. 4 comprises FIGS. 4(a)-4(d).
Figure 4D:
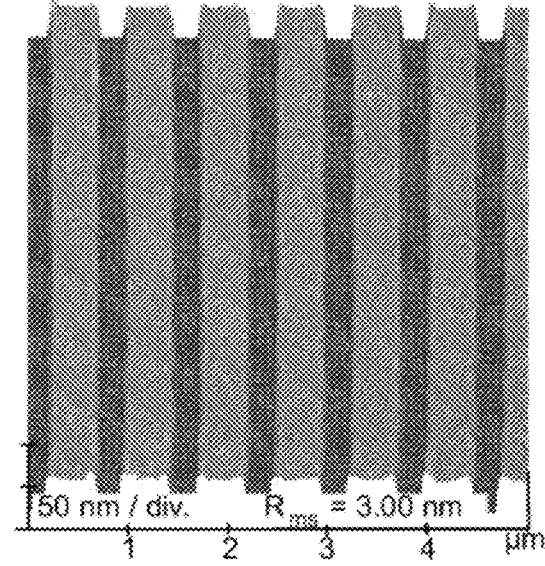

Further reducing the growth temperature to 350° C. [FIGS. 4(a)-4(d)] gives very interesting results. FIGS. 4(a) and 4(b) illustrate the surface morphology of Ge layers grown at 350° C. on blanket Si substrates for time periods of 750 seconds and 2000, respectively. FIGS. 4(c) and 4(d) illustrate the surface morphology of Ge layers grown at 350° C. on Si located at the bottom of an oxide-trench as described above for time periods of 320 seconds and 2000 seconds, respectively. At this low temperature only a very limited amount of Ge is thermally decomposed, and the growth rate is impractically low with a long incubation time on blanket Si. After Ge growth as long as 750 sec, only small and discrete islands were found on blanket Si substrate as shown in FIG. 4(a). After 2000 sec of growth, most-coalesced islands have formed but there are still some pits as indicated by an arrow in FIG. 4(b). The 350° C. growth has far smaller size and higher density of Ge islands than the ones at higher temperatures.

However, on the oxide-trench Si substrate, only 320 sec growth at 350° C. shows a continuous Ge layer inside the trench with uniform thickness [FIG. 4(c)]. Interestingly, its surface is extremely smooth and featureless as shown in the inset of FIG. 4(c) (Rms=1.02 overall, Rms=0.55 nm within the 300 μm×300 μm inset, which is an area substantially equal to the trench width squared). The higher overall Rms value reflects variations of Ge surface height from one trench to another, or along the length of the trenches. And the longer growth in FIG. 4(d) shows much a smoother layer with an Rms=3.00 nm compared to 400° C., although there is a slight pileup at the edge. It is worth noting that selectively grown Ge on oxide-trench at 350° C. results in an extremely smooth layer with uniform thickness and higher growth rate compared to the one on blanket Si. This shows that initial growth behavior on blanket and oxide-trench Si substrates are significantly different, which is understood to result from the dominant supply of Ge-containing species from the oxide.

These examples show that by lowering the growth temperature to a level impracticable for blanket growth, not only is it possible to obtain significant growth in confined areas (openings in insulators over the crystalline substrate), but it is preferable in order to obtain a surface with reduced roughness. In this example, typical Ge growth temperatures are higher than 400° C., but by growing the Ge in confined areas at a temperature lower than 400° C. (here at 350° C.), substantial growth of Ge with a reduced surface roughness can be obtained within the confined area. For example, when selectively growing Ge such as thin strained Ge growth on SiGe for higher mobility on ART, the initial growth behavior of selective Ge should be considered in addition to the traditional loading effect to obtain a reduced surface roughness Ge layer.

As previously noted, growth on the blanket silicon substrate in FIGS. 4(a) and 4(b) is dominated by the component of direct supply of Ge-containing species from the growth ambient. Since the silicon substrate within the oxide trenches will also be directly exposed to the Ge growth ambient, the Ge within the trenches should also have some growth component from the direct supply of Ge-containing species from the growth ambient. However, this component of growth will be minor in the trench Ge growth. The Ge growth in the oxide trenches is dominated by the component of the lateral supply of Ge-containing species for the oxide sidewall. We can estimate the relative contribution of the direct exposure component to the lateral supply component by estimating growth rates of FIGS. 4(a) and 4(b) (growth component from direct exposure to Ge-containing species only) to those of FIGS. 4(c) and 4(d) (growth components due to direct exposure and lateral supply of Ge-containing species).

The thickness of the Ge layers in FIGS. 4(a) and 4(b) can be estimated to be about ~1 nm and ~5 nm, respectively. It should be noted that in FIG. 4(a) there are only Ge islands and continuous layers were not even formed due to low growth rate, but based on the area density of the islands, it was estimated to be about 2 equivalent monolayers of Ge, which corresponds to ~1 nm thickness. The thickness of the Ge layers in FIGS. 4(c) and 4(d) is about 15 nm and 55 nm, respectively. For FIG. 4(a), the average growth rate was estimated to be 1 nm/750 sec=0.0013 nm/sec; for FIG. 4(b), the average growth rate was estimated to be 5 nm/2000 sec=0.0025 nm/sec; for FIG. 4(c), the average growth rate was estimated to be 15 nm/320 sec=0.0469 nm/sec; and for FIG. 4(d), the average growth rate was estimated to be 55 nm/2000 sec=0.0275 nm/sec. It should be noted that growth rate is not constant over the growth time since there is an incubation time before materials are formed during growth. Considering FIG. 4(c) as compared to FIG. 4(a), it can be determined that the component of growth due to the laterally supplied Ge containing species is over 35×'s than that of the component of growth due to direct exposure to the growth ambient. Considering the growth rates of FIGS. 4(b) and 4(d), it can be determined that the component of growth due to the laterally supplied Ge containing species is still over 10×'s than that of the component of growth due to direct exposure to the growth ambient.

While these examples are directed to the CVD growth of germanium on silicon, other materials may be used. For example, when epitaxially growing by CVD compounds of Group III (Al, Ga, In) and Group V (P, As) such as GaAs, AlGaAs, InGaAs, InAlAs, InGaAlAs, InP, GaP, InGaP, InAlGaP etc., a growth temperature of 500-800° C. is normally used to obtain sufficient growth rates on a blanket substrate. According to a further example, to reduce surface roughness of these materials when grown in a trench, it is preferred to grow these materials by CVD at a temperature less than 500° C., less than about 450° C., or less than about 400° C.

As another example, compounds of Group III (Al, Ga, In) and Group V (Sb) such as GaSb, AlSb and InSb are epitaxially grown by CVD on a blanket substrate with a growth temperature in the range of 400-700° C. According to a further example, to reduce surface roughness of these materials when grown in a confined area, such as an opening or trench in an insulator, it is preferred to grow these materials by CVD at a temperature less than 400° C., less than about 350° C., or less than about 300° C.

As another example, Group II-N compounds are epitaxially grown by CVD on a blanket substrate with a growth temperature in the range of 500-1100° C. According to a further example, to reduce surface roughness of these materials when grown a confined area, such as in an opening or trench in an insulator, it is preferred to grow Group III-N compounds by CVD at a temperature less than 500° C., less than about 450° C., or less than about 400° C.

As another example, Group II-VI compounds are epitaxially grown by CVD on a blanket substrate with a growth temperature in the range of 250-600° C. According to a further example, to reduce surface roughness of these materials when grown a confined area, such as in an opening or trench in an insulator, it is preferred to grow Group II-VI compounds by CVD at a temperature less than 250° C., at less than about 220° C. or less than about 200° C.

As another example, Group IV elements and compounds are epitaxially grown by CVD on a blanket substrate with a growth temperature in the range of 400-1000° C. According to a further example, to reduce surface roughness of these materials when grown a confined area, such as in an opening or trench in an insulator, it is preferred to grow these Group IV materials by CVD at a temperature less than 400° C., less than about 350° C., or less than about 300° C.

When epitaxially growing the Group IV, III-V, III-N and II-VI materials in accordance with the above, it is preferred, but not necessary that the surface roughness is reduced as described above.

Figure 5A:
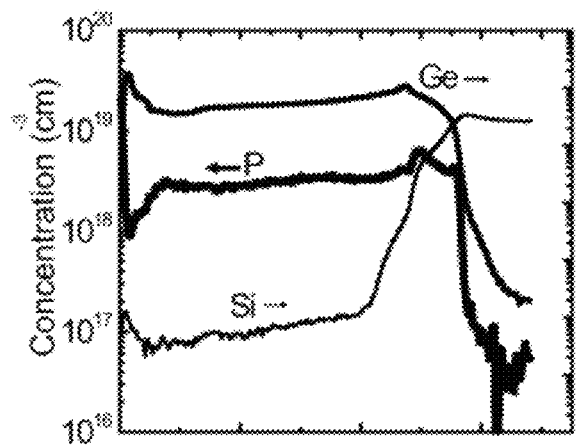
FIGS. 5(a)-5(d), illustrates SIMS depth profiles of (a) phosphorus and (b) boron in Ge inside the trenches after oxide removal and (c) phosphorus and (d) boron in Ge on blanket Si. Ge layers were deposited in two-steps at 400° C. for 540 sec and then at 600° C. for 1050 sec.
Figure 5C:
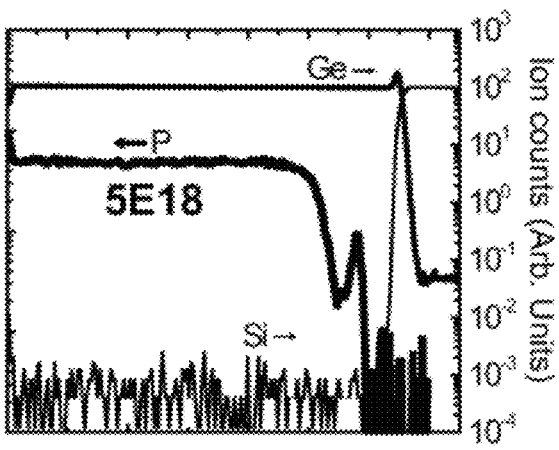
Figure 5B:
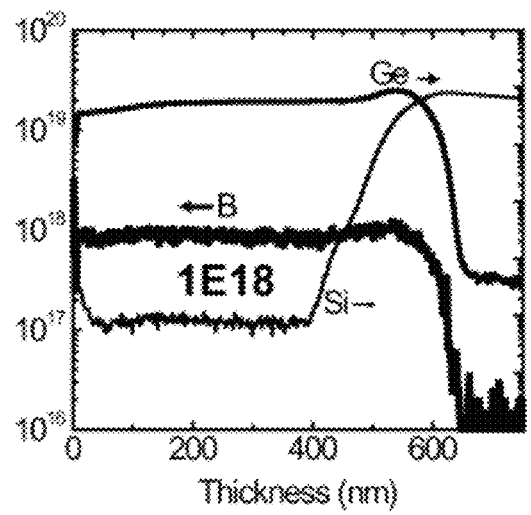
Figure 5D:
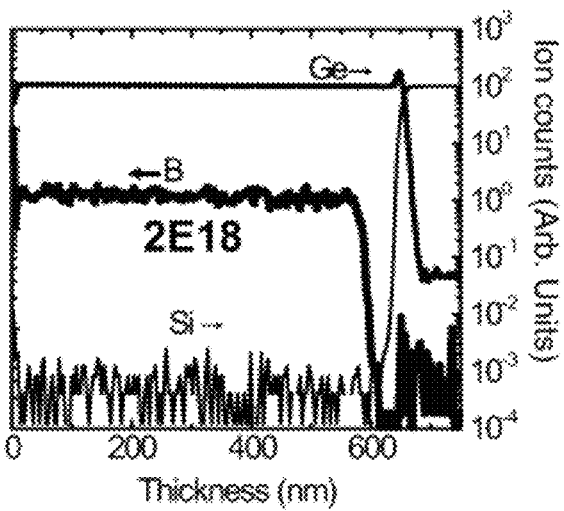

When epitaxially growing Ge with a dominant growth component from the lateral supply of Ge containing species from the sidewalls of the oxide trenches, doping is non-significantly effected as compared to Ge growth on a blanket substrate (with a dominant growth component due to the direct supply of Ge-containing species from the growth ambient). In-situ doping, boron and phosphorus doping levels were evaluated on Ge grown on oxide-trench Si and on blanket Si. To measure the doping level of Ge inside the trench, 500 nm thick boron- or phosphorus-doped Ge was grown inside the trench. The Ge was grown by CVD (using the same shared process parameters discussed above with respect to FIGS. 1-4) for 540 sec at 400° C. and then for an additional 1800 seconds at an increased temperature of 600° C. Thickness of oxide trench is 490 nm and Ge was slightly over oxide but not coalesced. The oxide was removed by a diluted HF as it was done for previously discussed AFM analysis. Phosphorus and boron SIMS depth profiles of Ge inside the trenches are shown in FIGS. 5(a) and 5(b), respectively. Depth profiles of Ge on blanket Si grown at the same conditions are shown for comparison in FIGS. 5(c) and 5(d). For the SIMS analysis, the incoming sputtering ion beam was set at an angle of 60 degree from the surface normal of the Si so that the Ge pillars are sputtered at least for the initial part of the pillar. The channel to detect signals was oriented perpendicular to the ion beam. And the dopant species are normalized point by point to the Ge signal intensity to quantify the signals. According to the data, both boron and phosphorus doping levels of Ge inside the trench were roughly half of those on blanket grown at the same conditions. There may be a doping measurement error close to the Si surface due to inconsistencies in the sputtering rate if the shape of the germanium pillars changes during sputtering process. However, this analysis demonstrates that the doping level in trenches does not show a significant difference of more than an order of magnitude from that on blanket silicon for identical growth process parameters.

As noted above, this invention has a wide variety of applications. While not limited to ART technology, this invention has many applications within ART technology. For example, use of this invention may be used to create strained Ge over a SiGe alloy grown in an opening within an insulator. One or both of the Ge and SiGe layers may be grown in accordance with the invention and/or may have a surface of reduced roughness. A wide variety of devices may incorporate the invention. While not limiting to these devices, the invention may be particularly applicable to mixed signal applications, field effect transistors, quantum tunneling devices, light emitting diodes, laser diodes, resonant tunneling diodes and photovoltaic devices, especially those using ART technology. application Ser. No. 11/857,047 filed Sep. 18, 2007 entitled "Aspect Ratio Trapping for Mixed Signal Applications"; application Ser. No. 11/861,931 filed Sep. 26, 2007 entitled "Tri-Gate Field-Effect Transistors formed by Aspect Ratio Trapping"; application Ser. No. 11/862,850 filed Sep. 27, 2007 entitled "Quantum Tunneling Devices and Circuits with Lattice-mismatched Semiconductor Structures"; application Ser. No. 11/875,381 filed Oct. 19, 2007 entitled "Light-Emitter-Based Devices with Lattice-mismatched Semiconductor Structures"; and application Ser. No. 12/100,131 filed Apr. 9, 2007 entitled "Photovoltaics on Silicon" are all hereby incorporated by reference as providing examples to which aspects of this invention may be particularly suited.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof are used to connote both direct and indirect connections/couplings. As another example, "having" and "including", derivatives thereof and similar transitional terms or phrases are used synonymously with "comprising" (i.e., all are considered "open ended" terms)-only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method of manufacturing a semiconductor structure, comprising:
   providing a crystalline substrate;
   forming an insulator defining an opening to a surface of the substrate; and
   growing a crystalline material lattice-mismatched with the substrate within the opening of the insulator, the crystalline material having a top surface with a root mean square surface roughness of 5 nm or less achieved without a planarization step to planarize the top surface, at least one edge defining a first surface of the crystalline material, the top surface of the crystalline material being at least a portion of the first surface of the crystalline material, the edge being defined by a junction of the first surface and a respective sidewall of the crystalline material.

2. The method of claim 1, wherein the step of growing the crystalline material within the openings includes trapping defects in the crystalline material arising from the lattice mismatch at a sidewall of the insulator.

3. The method of claim 1, wherein an aspect ratio of the opening is 1 or greater.

4. The method of claim 1, wherein the crystalline material is a group IV material.

5. The method of claim 1, wherein the crystalline material comprises a group III-V compound.

6. The method of claim 1, wherein the crystalline material comprises a group II-VI compound.

7. The method of claim 1, wherein the growing the crystalline material is an epitaxial growth at a temperature of less than 500° C.

8. The method of claim 1, wherein the growing the crystalline material includes growing at processing conditions such that a component of growth of the crystalline material due to a lateral supply of the crystalline material containing species from a sidewall of the opening is greater than a component of growth of the crystalline material due to direct supply of the crystalline material containing species from a growth ambient.

9. The method of claim 8, wherein the component of growth of the crystalline material due to the lateral supply of the crystalline material containing species from the sidewall of the opening is at least 10 times greater than the component of growth of the crystalline material due to direct supply of the crystalline material containing species from the growth ambient.

10. The method of claim 8, wherein the processing conditions include a growth temperature of less than 500° C.

11. The method of claim 8, wherein the insulator is an oxide.

12. The method of claim 8, wherein the crystalline material comprises a material selected from the group consisting essentially of a IV element or alloy, a III-V compound, a III-N compound, a II-VI compound, and a combination thereof.

13. The method of claim 1, wherein the substrate comprises a recess, the insulator being on recess sidewalls of the recess to form the opening to the surface of the substrate.

14. The method of claim 1, wherein the opening is a trench, the trench having an area exposing the surface of the substrate, the area being adjacent the surface of the substrate, the area having a length greater than a width.

15. The method of claim 1, wherein the substrate is (100) silicon.

16. The method of claim 1, wherein the growing the crystalline material is an epitaxial growth at a temperature of less than 400° C.

17. The method of claim 1, wherein the growing the crystalline material is an epitaxial growth at a temperature of less than 350° C.

18. The method of claim 1, wherein the top surface of the crystalline material has a root mean square surface roughness of 3 nm or less achieved without a planarization step to planarize the top surface.

19. The method of claim 1, wherein the top surface of the crystalline material has a root mean square surface roughness of 1 nm or less achieved without a planarization step to planarize the top surface.

20. The method of claim 1, wherein edges define the first surface of the crystalline material, the top surface of the crystalline material being coextensive with the first surface of the crystalline material, each of the edges being defined by a junction of the top surface and a respective sidewall of the crystalline material.

* * * * *